United States Patent
Nagengast et al.

(10) Patent No.: US 12,214,469 B2
(45) Date of Patent: Feb. 4, 2025

(54) POLISHING HEAD RETAINING RING TILTING MOMENT CONTROL

(71) Applicant: Applied Materials, Inc., Santa Clara, CA (US)

(72) Inventors: Andrew Nagengast, Sunnyvale, CA (US); Steven M. Zuniga, Soquel, CA (US); Jay Gurusamy, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 257 days.

(21) Appl. No.: 17/501,687

(22) Filed: Oct. 14, 2021

(65) Prior Publication Data

US 2022/0111484 A1 Apr. 14, 2022

Related U.S. Application Data

(60) Provisional application No. 63/091,710, filed on Oct. 14, 2020.

(51) Int. Cl.
*B24B 37/32* (2012.01)
*B24B 37/005* (2012.01)
(Continued)

(52) U.S. Cl.
CPC ............ *B24B 37/32* (2013.01); *B24B 37/005* (2013.01); *B24B 49/16* (2013.01); *H01L 21/30625* (2013.01)

(58) Field of Classification Search
None
See application file for complete search history.

(56) References Cited

U.S. PATENT DOCUMENTS

| 5,957,751 A | 9/1999 | Govzman et al. |
| 6,080,050 A | 6/2000 | Chen et al. |

(Continued)

FOREIGN PATENT DOCUMENTS

| CN | 107717718 A | 2/2018 |
| EP | 0747167 A2 | 12/1996 |

(Continued)

OTHER PUBLICATIONS

Machine Generated English Translation of JP 09193010A. Held to Katakabe, Ichiro et al. Published Jul. 29, 1997. (Year: 1997).*

(Continued)

*Primary Examiner* — Sylvia MacArthur
(74) *Attorney, Agent, or Firm* — Patterson + Sheridan, LLP

(57) ABSTRACT

Embodiments herein generally relate to chemical mechanical polishing (CMP) systems used in the manufacturing of electronic devices. In one embodiment, a substrate carrier for polishing a surface of a substrate includes a retaining ring configured to surround a substrate during a polishing process. The retaining ring includes a first surface that is configured to contact a surface of a polishing pad during the polishing process, a second surface that is on a side of the retaining ring that is opposite to the first surface, and an array of recesses formed in the second surface. The substrate carrier for polishing a surface of a substrate also includes a plurality of load bearing pins where each load bearing pin of the plurality of load bearing pins includes a contact surface and a body that has a length, and at least a portion of the length of each load bearing pin of the plurality of load bearing pins is disposed within each recess of the array of recesses and the contact surface of each load bearing pin of the plurality of load bearing pins is positionable relative to (Continued)

a surface of the recess in which it is disposed during the polishing process.

20 Claims, 11 Drawing Sheets

(51) Int. Cl.
*B24B 49/16* (2006.01)
*H01L 21/306* (2006.01)

(56) References Cited

U.S. PATENT DOCUMENTS

| | | | |
|---|---|---|---|
| 6,113,468 A * | 9/2000 | Natalicio | B24B 37/32 451/41 |
| 6,132,298 A | 10/2000 | Zuniga et al. | |
| 6,146,259 A | 11/2000 | Zuniga et al. | |
| 6,146,463 A * | 11/2000 | Yudovsky | H01L 21/68 118/728 |
| 6,159,079 A | 12/2000 | Zuniga et al. | |
| 6,162,116 A | 12/2000 | Zuniga et al. | |
| 6,165,058 A | 12/2000 | Zuniga et al. | |
| 6,186,092 B1 * | 2/2001 | Tsai | C23C 16/45521 118/500 |
| 6,241,593 B1 | 6/2001 | Chen et al. | |
| 6,358,121 B1 | 3/2002 | Zuniga | |
| 6,361,419 B1 | 3/2002 | Zuniga et al. | |
| 6,558,232 B1 * | 5/2003 | Kajiwara | B24B 49/16 451/41 |
| 6,572,446 B1 | 6/2003 | Osterheld et al. | |
| 6,602,114 B1 | 8/2003 | Wang et al. | |
| 6,645,044 B2 | 11/2003 | Zuniga | |
| 6,663,466 B2 | 12/2003 | Chen et al. | |
| 6,722,965 B2 | 4/2004 | Zuniga et al. | |
| 6,776,694 B2 | 8/2004 | Zuniga et al. | |
| 6,835,125 B1 | 12/2004 | Tseng et al. | |
| 6,848,980 B2 | 2/2005 | Chen et al. | |
| 6,890,249 B1 | 5/2005 | Zuniga et al. | |
| 7,001,257 B2 | 2/2006 | Chen et al. | |
| 7,001,260 B2 | 2/2006 | Chen et al. | |
| 7,207,871 B1 | 4/2007 | Zuniga et al. | |
| 7,255,771 B2 | 8/2007 | Chen et al. | |
| 7,459,057 B2 | 12/2008 | Zuniga et al. | |
| 7,534,364 B2 | 5/2009 | Zuniga et al. | |
| 9,368,371 B2 * | 6/2016 | Oh | B24B 37/04 |
| 9,751,189 B2 | 9/2017 | Chen et al. | |
| 2002/0074478 A1 * | 6/2002 | Keller | B24B 37/30 248/694 |
| 2002/0077051 A1 * | 6/2002 | Keller | B24B 37/32 451/398 |
| 2003/0096564 A1 * | 5/2003 | Numoto | B24B 37/30 451/285 |
| 2004/0065412 A1 * | 4/2004 | Ensinger | B24B 37/32 156/345.14 |
| 2013/0196573 A1 * | 8/2013 | Fukushima | B24B 37/04 451/36 |
| 2016/0020133 A1 | 1/2016 | Kim et al. | |
| 2016/0211166 A1 | 7/2016 | Yan et al. | |
| 2016/0368115 A1 * | 12/2016 | Yasuda | B24B 47/12 |
| 2018/0158717 A1 * | 6/2018 | Hanzlik | H01L 21/68728 |
| 2020/0276686 A1 | 9/2020 | Nagengast et al. | |
| 2022/0111484 A1 * | 4/2022 | Nagengast | B24B 37/32 |

FOREIGN PATENT DOCUMENTS

| | | | | |
|---|---|---|---|---|
| JP | 09193010 | | 7/1997 | |
| JP | 09193010 A | * | 7/1997 | B24B 37/32 |
| JP | H11347918 A | | 12/1999 | |
| JP | 2001-039450 A | | 2/2001 | |
| JP | 2001096456 A | | 4/2001 | |
| JP | 2003-039306 A | | 2/2003 | |
| JP | 2007-053164 A | | 3/2007 | |
| KR | 20160138352 A | * | 12/2016 | |
| TW | 467803 B | | 12/2001 | |
| TW | 200300375 A | | 6/2003 | |
| TW | 200833465 A | | 8/2008 | |
| WO | 2020176385 A1 | | 9/2020 | |

OTHER PUBLICATIONS

JP Office Action dated Sep. 5, 2023 for Application No. JP2022-544286. (with Translation).
International Search Report dated Feb. 3, 2022 for Application No. PCT/US2021/053926.
Taiwan Office Action dated Nov. 28, 2023 for Application No. 110137923.
Taiwan Office Action Dated Jan. 3, 2024 for Application No. 110137923.
Taiwan Office Action dated May 21, 2024 for Application No. 110137923.
Korean Office Action dated Feb. 20, 2024 for Application No. 10-2022-7025812.

* cited by examiner

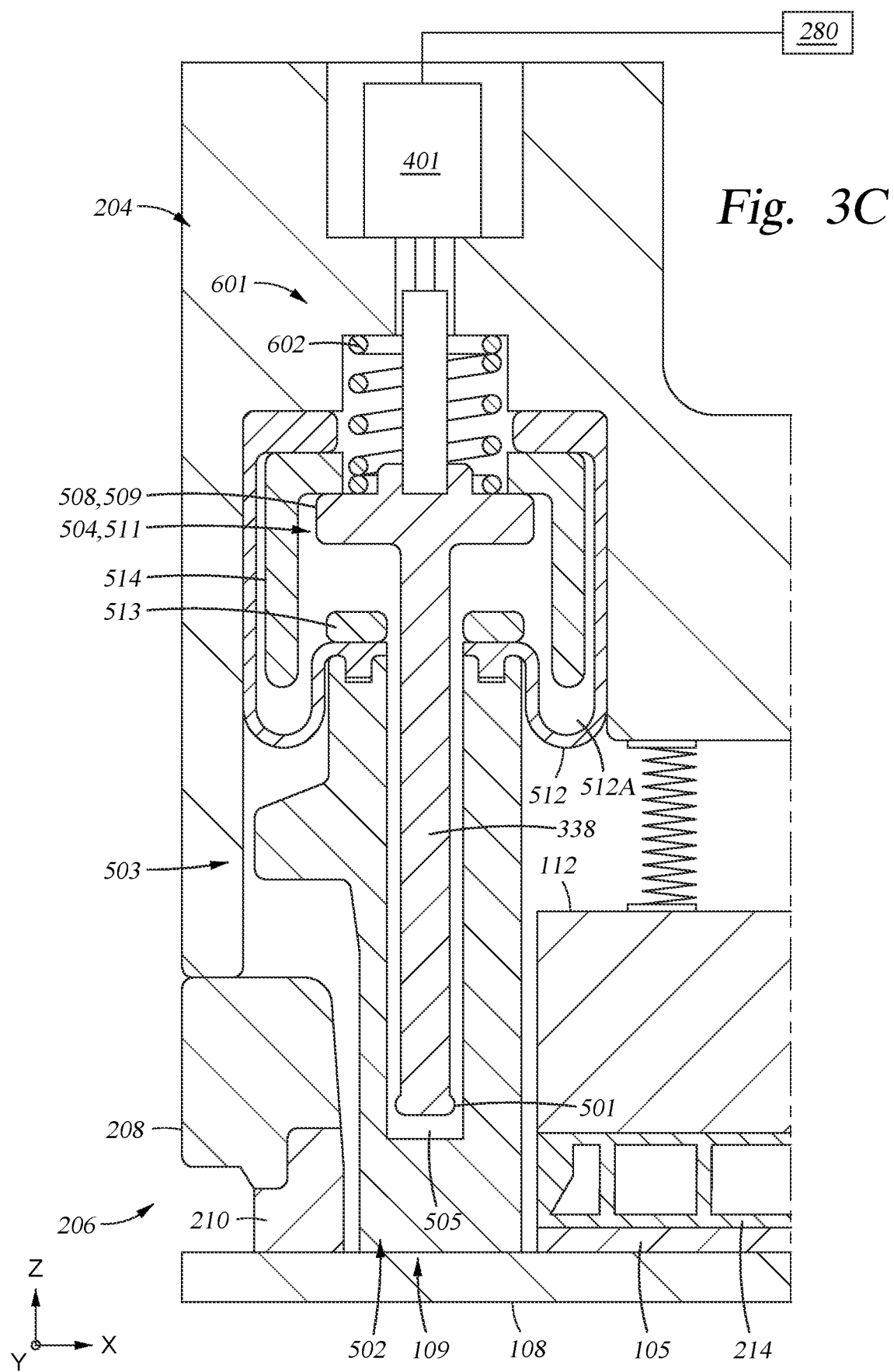

POLISHING HEAD RETAINING RING TILTING MOMENT CONTROL

CROSS-REFERENCE TO RELATED APPLICATIONS

This application claims benefit of U.S. Provisional Patent Application No. 63/091,710, filed Oct. 14, 2020, which is herein incorporated by reference.

BACKGROUND

Field

Embodiments of the present invention generally relate to chemical mechanical polishing (CMP) systems used in the manufacturing of semiconductor devices. In particular, embodiments herein relate to methods and apparatus for uniform planarization of a surface of a substrate during CMP processing.

Description of the Related Art

Chemical mechanical polishing (CMP) is commonly used in the manufacturing of semiconductor devices to planarize or polish a layer of material deposited on a substrate surface. In a typical CMP process, a substrate is retained, by a retaining ring, in a substrate carrier which includes a membrane that contacts a backside of the substrate and urges a material layer surface on the front-side of the substrate towards a rotating polishing pad in the presence of a polishing fluid. Generally, the polishing fluid comprises an aqueous solution of one or more chemical constituents and nanoscale abrasive particles suspended in the aqueous solution. Material is removed across the material layer surface of the substrate through a combination of chemical and mechanical activity, which is provided by the polishing fluid, and an abrasive action created by the relative motion of the substrate and the polishing pad.

During substrate polishing, a polishing shear force is created by friction generated between the substrate and the polishing pad and the retaining ring, which is disposed around the substrate, and the polishing pad. Wear on the retaining ring and stiffness within the elements that couple the substrate carrier to the polishing system cause the retaining ring to tilt relative to the polishing pad surface, and thus generate undesirable moments and reaction forces that affect the uniformity of the material removal process across the surface of the substrate during polishing. A tilting moment created by this tilt may lead to further wear on the retaining ring and contribute to non-uniformities near the edge of the substrate during a CMP process.

Accordingly, there is a need in the art for articles and related methods that solve the problem described above.

SUMMARY

Embodiments of the present disclosure generally relate to chemical mechanical polishing (CMP) systems used in the manufacturing of semiconductor devices and methods for the same. In one embodiment, a substrate carrier for polishing a surface of a substrate includes a retaining ring configured to surround a substrate during a polishing process. The retaining ring includes a first surface that is configured to contact a surface of a polishing pad during the polishing process, a second surface that is on a side of the retaining ring that is opposite to the first surface, and an array of recesses formed in the second surface. The substrate carrier for polishing a surface of a substrate also includes a plurality of load bearing pins where each load bearing pin of the plurality of load bearing pins includes a contact surface and a body that has a length, and at least a portion of the length of each load bearing pin of the plurality of load bearing pins is disposed within each recess of the array of recesses and the contact surface of each load bearing pin of the plurality of load bearing pins is positionable relative to a surface of the recess in which it is disposed during the polishing process.

In one embodiment, a substrate carrier for polishing a surface of a substrate includes a retaining ring configured to surround a substrate during a polishing process, the retaining ring includes a first surface that is configured to contact a surface of a polishing pad during the polishing process, a second surface this is on a side of the retaining ring that is opposite to the first surface, and an array of recesses formed in the second surface. The substrate carrier for polishing a surface of a substrate also includes a plurality of load bearing pins, each load bearing pin of the plurality of load bearing pins having a contact surface that is positionable relative to a surface of the recess in which it is disposed during the polishing process, and one or more actuator assemblies coupled to one or more of the plurality of load bearing pins, the one or more actuator assemblies configured to adjust a position of the contact surface of one or more of the plurality of load pins relative to the surface of the recess in which it is disposed.

In one embodiment, a method of polishing a substrate, including positioning a portion of a load bearing pin in each recess of an array of recesses formed in a first surface of a retaining ring. The retaining ring includes a polishing pad contact surface that is positioned on a side of the retaining ring that is opposite to a side on which the first surface is disposed, the retaining ring is configured to surround a substrate during a polishing process, and the portion of the load bearing pin positioned in the recess comprises a contact surface. The method of polishing a substrate also includes rotating a substrate carrier assembly about a central carrier axis and urging the polishing pad contact surface of the retaining ring against a surface of a polishing pad, and the contact surface of each of the load bearing pins is positionable relative to a surface of the recess in which it is disposed during the polishing process.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 3C a cross-sectional view of a portion of the substrate carrier assembly of FIG. 2B according to one embodiment.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
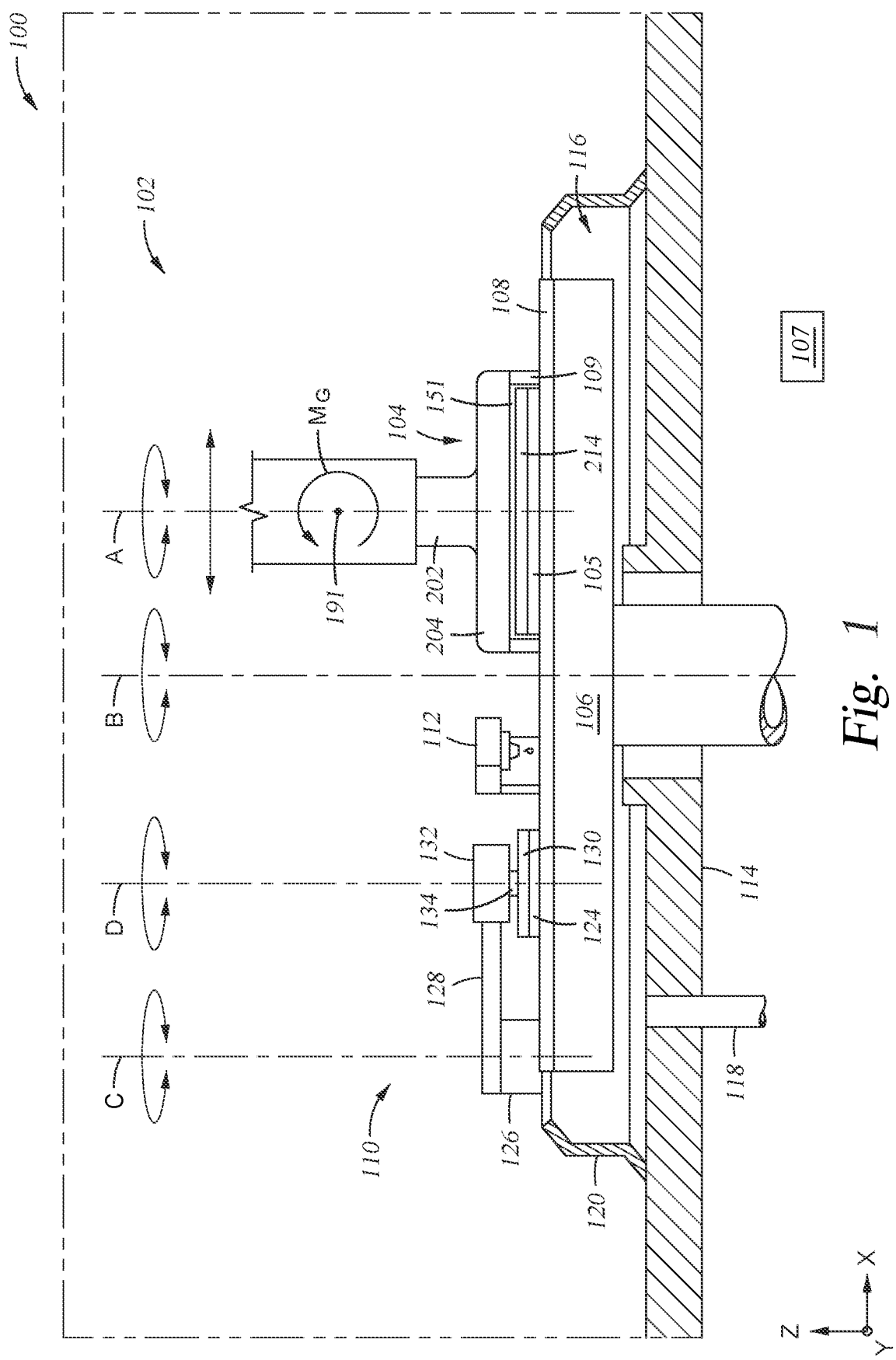
FIG. 1 is a schematic side view of a polishing system for use according to embodiments disclosed herein.

Embodiments herein generally relate to chemical mechanical polishing (CMP) systems used in the manufacturing of electronic devices. In particular, embodiments herein relate to substrate carriers used for CMP processing of semiconductor substrates and methods for the same.

Embodiments described herein provide substrate carriers configured to control a tilting moment MG (FIG. 1) generated by the interaction of a retaining ring, which surrounds a substrate, and a polishing pad during a CMP process. In some embodiments, the effect of the generated tilting moment is controlled by positioning load bearing pins, or simply load pins, that have a desired shape and orientation at a desired location within the retaining ring to counteract the tilting moment MG created due to an undesirable stiffness in the elements that couple the substrate carrier to the polishing system (e.g., gimbal assembly) as the substrate carrier is rotated about its central axis and translated across the polishing pad by various hardware components. The stiffness, or resistance in the elements that couple the substrate carrier to the polishing system to a torsional movement, generates retaining ring reaction forces that act at a distance from these coupling elements, which creates the tilting moment MG. The tilting moment MG is thus generally formed due to the resistance of the elements that couple the substrate carrier to the polishing system to the changing position of the retaining ring relative to polishing pad as the retaining ring and the polishing pad are continually rotated and moved relative to each other during a CMP polishing process. The tilting moment experienced by the carrier retaining ring 502 thus prevents the lower surface (i.e., polishing pad contact surface) of the retaining ring from uniformly contacting the surface of the polishing pad during processing, which prevents the retaining ring, which is disposed near the edge of the substrate, from being able to control and/or uniformly provide a pressure distribution to the surface of the polishing pad near the edge of the substrate 105 during polishing, particularly in a radial direction relative to the substrate's center. The application of pressure by the retaining ring to the polishing pad surface during processing is used to reduce the various edge effects (e.g., "check mark" effect or "knife edge" effect) naturally experienced at the edge of a substrate during a polishing process.

Additionally, the substrate, the substrate chuck element, or other inner components of the substrate carrier often shift underneath the substrate carrier and impact the radially inner surface of the retaining ring. The contact between the substrate and/or substrate carrier and the inner surface of the retaining ring can generate a lateral impact force that is exerted on the radially inner surface of the retaining ring, which can undesirably affect the loads and/or moments experienced by the retaining ring during polishing, and thus generate polishing non-uniformities that are also solved by one or more of the embodiments of the disclosure provided herein.

As is discussed further below, by at least controlling the position, and thus the interaction of load pins within the retaining ring, the reaction forces experienced by the retaining ring, and in turn by the substrate, can be controlled. In some embodiments, one or more actuator assemblies are used to position the load pins within the retaining ring, thereby adjusting the location of contact of the load pins relative to a polishing pad contact surface of the retaining ring. Adjusting the location of contact increases or decreases the moment generated to counteract the tilting moment MG experienced by the retaining ring due to at least the shear and impact related forces applied to the retaining ring during a polishing process. It is also believed that as the retaining ring wears, the tilting moment MG increases or varies over time which will typically result in polishing uniformity issues within a substrate or from substrate-to-substrate, particularly on radially outward edges of the substrate. In some embodiments, by actively adjusting the position of the load pins within the retaining ring, the tilting moment MG can be controlled and/or kept constant during processing and the pressure distribution on the substrate, particularly on the radially outward edges of the substrate, can be kept uniform.

FIG. 1 is a schematic side view of a polishing system 100 for use according to embodiments disclosed herein. The polishing system 100 includes a polishing station 102 and system controller 107. The system controller 107 generally controls the activities and operating parameters of the automated components found in the polishing system 100. In general, the movement of a substrate 105 through portions of the polishing system 100, such as through a polishing station 102, is performed using the various automated devices disclosed herein by use of commands sent by the system controller 107. The system controller 107 is a general use computer that is used to control one or more components found in the polishing system 100. The system controller 107 is generally designed to facilitate the control and automation of one or more of the processing sequences disclosed herein and typically includes a central processing unit (CPU) (not shown), memory (not shown), and support circuits (or I/O) (not shown). Software instructions and data can be coded and stored within the memory (e.g., non-transitory computer readable medium) for instructing the CPU. A program (or computer instructions) readable by the processing unit within the system controller 107 determines which tasks are performable in the polishing system 100. For example, the non-transitory computer readable medium includes a program which when executed by the processing unit are configured to perform one or more of the methods described herein. Preferably, the program includes code to perform tasks relating to monitoring, execution and control of the movement, support, and/or positioning of a substrate along with the various process recipe tasks and various polishing station 102 process recipe steps being performed therein.

As shown the polishing station 102 includes a carrier assembly 104, a platen 106, a polishing pad 108 mounted on the platen 106 and secured thereto, a pad conditioner assembly 110 for cleaning and/or rejuvenating the polishing pad, and a fluid delivery arm 112 for dispensing polishing fluid onto the polishing pad 108. A gimbal assembly 191 couples the carrier assembly 104 to various hardware components (not shown) that are configured to cause the carrier assembly 104 to rotate about the axis A and be simultaneously translated across the surface of the polishing pad 108 during a polishing process. The carrier assembly 104 generally includes a retaining ring 109, carrier member 204, housing member 202 and first membrane 214, which are all described in greater detail below. Here, the platen 106 is disposed above a base plate 114 and is circumscribed by a platen shield 120 (both shown in cross section) which collectively define a drainage basin 116. The drainage basin 116 is used to collect fluids spun radially outward from the platen 106 and to drain the fluids through a drain 118 in fluid communication therewith.

The pad conditioner assembly 110 is used to clean and/or rejuvenate the polishing pad 108 by abrading the surface of the polishing pad 108 by urging a conditioner disk 124 (e.g., a diamond impregnated disk) there against. Pad conditioning operations may be done between polishing substrates, i.e., ex-situ conditioning, concurrently with polishing a substrate, i.e., in-situ conditioning, or both.

Here, the pad conditioner assembly 110 includes a first actuator 126 disposed on the base plate 114, a conditioner arm 128 coupled to the first actuator 126, and a mounting plate 130 having the conditioner disk 124 fixedly coupled thereto. A first end of the conditioner arm 128 is coupled to the first actuator 126, and the mounting plate 130 is coupled to a second end of the conditioner arm 128 that is distal from the first end. The first actuator 126 is used to sweep the conditioner arm 128, and thus the conditioner disk 124, about an axis C so that the conditioner disk 124 oscillates between an inner radius of the polishing pad 108 and an outer radius of the polishing pad 108 while the polishing pad 108 rotates there beneath. In some embodiments, the pad conditioner assembly 110 further includes a second actuator 132 disposed at, and coupled to, the second end of the conditioner arm 128. The second actuator 132 is used to rotate the conditioner disk 124 about an axis D. Typically, the mounting plate 130 is coupled to the second actuator 132 using a shaft 134 disposed there between.

In some embodiments, the rotating substrate carrier assembly 104 is swept back and forth from an inner radius to an outer radius of the platen 106 while the platen 106, and thus the polishing pad 108, rotate about a platen axis B there beneath. The polishing fluid is delivered to the polishing pad 108 using the fluid delivery arm 112 positioned there over and is further delivered to a polishing interface between polishing pad 108 and the substrate 105 by the rotation of the polishing pad 108 about the platen axis B. Often, the fluid delivery arm 112 further includes a delivery extension member and a plurality of nozzles. The plurality of nozzles are used to deliver polishing fluid or relatively high pressure streams of a cleaner fluid, e.g., deionized water, to the polishing pad 108.

The substrate carrier assembly 104 includes a mounting surface on which the substrate 105 is positioned and retained during processing. During substrate processing, the substrate carrier assembly 104 surrounds the substrate 105 and exerts a downward force on the substrate 105 to enable the polishing process and prevent the substrate 105 from slipping out from underneath the substrate carrier assembly 104. The substrate 105, is often chucked to the substrate carrier assembly 104. The substrate carrier assembly 104 rotates about the carrier axis A, while urging the substrate 105 against the polishing pad 108. As noted above, the substrate carrier assembly 104 is additionally translated in an oscillating motion over the top surface of the polishing pad.

Figure 2A:
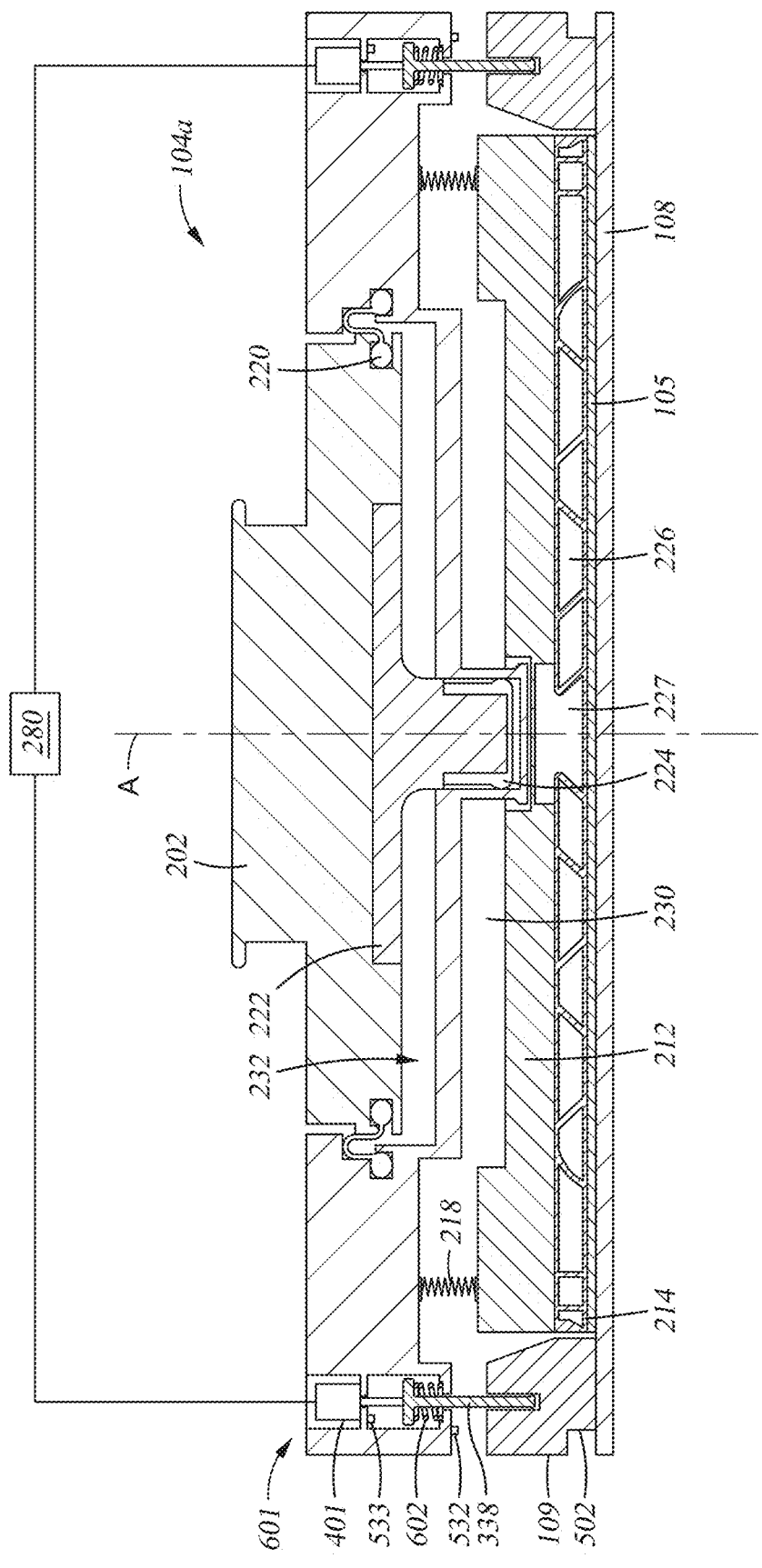
FIGS. 2A-2B are schematic side views of two substrate carrier assemblies, such as the substrate carrier assembly in FIG. 1, according to different embodiments.
Figure 2B:
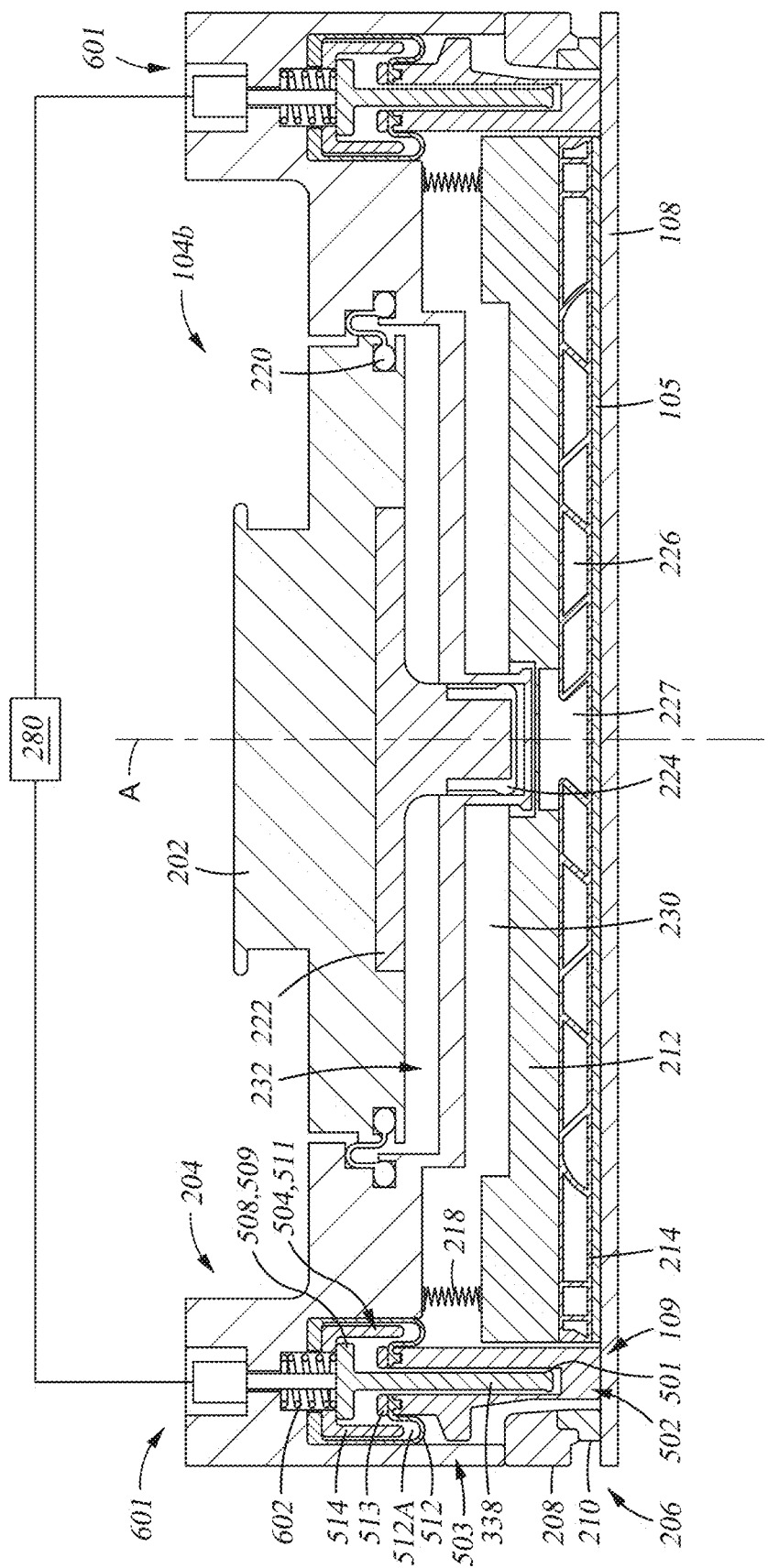

FIGS. 2A-2B are schematic side views of two different substrate carrier assemblies 104a and 104b, according to different embodiments, that may be used as the substrate carrier assembly 104 illustrated in FIG. 1. It is contemplated that in embodiments herein, the described elements of each of substrate carrier assembly 104a or 104b can be combined with and/or substituted for the elements of the other substrate carrier assembly 104a or 104b. Generally, each of the substrate carrier assemblies 104a-b features a housing member 202, a carrier member 204, the retaining ring 109 coupled to the carrier member 204, a support plate 212 disposed radially inward of the carrier member 204 and the retaining ring 109, and a first membrane 214, such as a substrate chucking membrane, disposed below the support plate 212 to provide a mounting surface for the substrate 105. For the description of FIGS. 2A-2B, the term radially outward is used with reference to the carrier axis A, i.e., the rotational axis of each of the substrate carrier assemblies 104a-b during polishing (FIG. 1), unless stated otherwise. In some embodiments, the retaining ring 109 may include two or more elements that are used to improve mechanical stability and robustness of the hardware and/or improve polishing process results. While the retaining ring 109 is generally illustrated herein as containing a single solid element, this configuration is not intended to be limiting as to the scope of the disclosure provided herein, since a more complex multi-element retaining ring may alternately be used with any of the embodiments disclosed herein.

As described above, each of the substrate carrier assemblies 104a-b of FIGS. 2A-2B are used to apply a downward force to a backside (non-active) surface of a substrate 105. The downward force exerted by the substrate carrier assembly 104a or 104b is used to urge the substrate 105 against a surface of the polishing pad 108. Each of the substrate carrier assemblies 104a-b are configured to retain the substrate 105 underneath the substrate carrier assembly 104a-b throughout the polishing process.

In some instances, the substrate 105 and/or the entire support plate 212 and the first membrane 214 are moveable within a carrier volume 252. The carrier volume 252 is defined as the volume underneath the housing member 202 and a carrier member 204 of the carrier assembly 104 and above the surface of the polishing pad 108. The majority of the carrier volume 252 is occupied by the support plate 212 and the first membrane 214.

The housing member 202 is a support member and an uppermost portion of each of the substrate carrier assemblies 104a-b. The upper surface of the housing member 202 is connected to a mating flange (not shown) that is coupled to the gimbal assembly 191 (not shown), which allows the substrate and a substrate carrier assembly 104a, 104b to be positioned substantially parallel to the polishing surface of the polishing pad during processing. In some embodiments, the housing member 202 includes a centering piece 222, which is disposed on the bottom surface of the housing member 202 and is centered about the carrier axis A. The centering piece 222 further includes a cover 224. The cover 224 is disposed about a portion of an extension of the centering piece 222, which extends downwards. The cover 224 is configured to reduce the friction force between the centering piece and a depression within the carrier member 204. The carrier member 204 is disposed around and coupled to the housing member 202. The carrier member 204 is disposed around each of the support plate 212 and the first membrane 214. The carrier member 204 covers each of the support plate 212 and the first membrane 214 and is disposed between the support plate 212 and the housing member 202. The carrier member 204 includes an outer portion which extends downward and around the outer diameters of the support plate 212 and the first membrane 214.

The support plate 212 and the first membrane 214 are attached to the carrier member 204 using a first flexible member 218 as described herein. The first flexible member 218 is an annular flexure and allows the substrate 105, the support plate 212, and the first membrane 214 to move relative to the carrier member 204 during substrate processing in both a vertical and a horizontal direction (wherein the vertical direction is parallel to the carrier axis A and the horizontal direction is parallel to the top surface of the polishing pad 108 (FIG. 1)). The first flexible member 218 may bend or deform to allow vertical movement of the support plate 212 with respect to the carrier member 204. The first flexible member 218 simultaneously supports the load of the support plate 212 while allowing for controlled movement of the support plate 212.

The support plate 212, the carrier member 204, and the first flexible member 218 collectively define the first volume 230 between the support plate 212 and the carrier member 204. Typically, the first volume 230 and a plurality of channels 226 formed in the first membrane 214 are each individually pressurized during polishing to cause the support plate 212 and the first membrane 214 to exert a downward force on the substrate 105 while the substrate carrier assembly 104a, 104b rotates about the carrier axis A, thus urging the substrate 105 against the polishing pad 108 (FIG. 1). One or more of the channels 226 formed in the first membrane 214 are annular and are centered about the carrier axis A. For example, in FIGS. 2A-2B a first channel 227 is disposed at the rotational center of the substrate carrier assembly 104a-b such the carrier axis A is disposed therethrough, and a plurality of annular channels 226 (eight shown) are disposed around the first channel 227 and are spaced radially outward from the carrier axis A. In some embodiments, about 5 channels 226 to about 15 channels 226, such as about 6 channels 226 to about 12 channels 226, such as about 7 channels 226 to about 10 channels 226 may be included. Each of the channels 226 are in fluid communication with gas passages formed within the support plate 212. The channels 226 are used to apply positive or negative gas pressures to a backside surface of the substrate 105. The first membrane 214 is formed from a soft and/or flexible material, such as an elastomeric material (e.g. silicon material) that allows deflection of the first membrane 214 as the pressure within each of the annular channels 226 is increased or reduced. Each of the channels 226 may have a different or the same gas pressures to enable different levels of vacuum force across the radius of the substrate 105.

Before and after polishing, a vacuum is applied to the first volume 230 so that the first membrane 214 is deflected upwards to create a low pressure pocket between the first membrane 214 and the substrate 105, thus lifting the support plate 212 and a chucked substrate 105 from the surface of the polishing pad. The substrate may be "chucked" to the first membrane 214 by applying a vacuum pressure to one or more of the plurality of channels 226 formed in the first membrane 214. The first membrane 214 is coupled to the bottom of the support plate 212. The first membrane 214 is thus also configured to grip the surface of the substrate 105 by applying a vacuum to one or more of the plurality of channels 226 formed in the first membrane 214. The first membrane 214 extends across substantially the entire bottom surface of the support plate 212.

A second flexible support 220 is disposed between the carrier member 204 and the housing member 202. The second flexible support 220 is an annular support coupling the carrier member 204 to the housing member 202. A second volume 232 is defined between the carrier member 204 and the housing member 202. The second flexible support 220 forms a seal between the carrier member 204 and the housing member 202 in order to allow a pressure formed within the second volume 232 to be adjusted relative to the surrounding environment and thus allow the carrier member 204 to be displaced relative to the housing member 202 due to the extension or retraction of the flexible support 220. Therefore, the pressure formed within the second volume 232 can be used to influence the vertical deflection of the carrier member 204 with respect to the housing member 202, and in some cases, as discussed below relative to FIGS. 2B and 3C, a down force can be separately applied to a polishing pad by a carrier ring assembly 206 that is coupled to the carrier member 204.

Figure 3A:
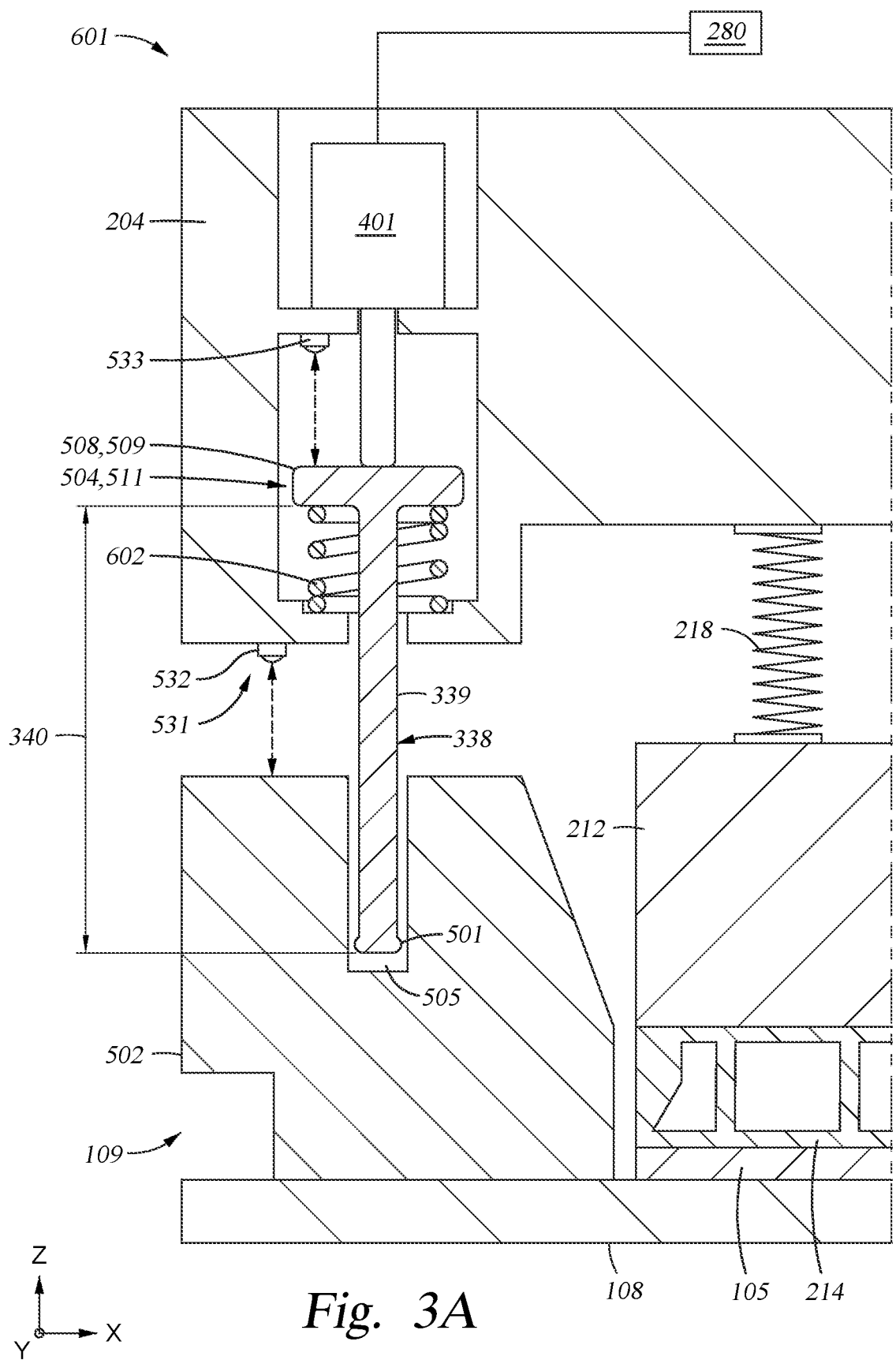
FIG. 3A a cross-sectional view of a portion of the substrate carrier assembly of FIG. 2A according to one embodiment.

In some embodiments, as shown in FIGS. 2A and 3A, the retaining ring 109 is disposed below the outer portion of the carrier member 204. In some embodiments of the substrate carrier assembly 104, such as substrate carrier assembly 104a (FIG. 2A), the substrate carrier assembly includes an actuator assembly 601, a retaining ring 109, a load pin ring 504 and a plurality of load pins 338 that are coupled to a portion of the load pin ring 504.

FIG. 3A is a cross-sectional view of a portion of the substrate carrier assembly 104a of FIG. 2A according to one embodiment. More particularly, FIG. 3A is an expanded, cross-sectional view of the retaining ring 109 that is coupled to the carrier member 204 through the actuator assembly 601. The retaining ring 109 includes a carrier retaining ring 502 that includes an array of upper recesses 505 configured to accept the load pins 338 of the actuator assembly 601. In some embodiments, each upper recess 505 is a blind hole, or blind slot, that has a surface (e.g., vertical surface in FIG. 3A) that is configured to contact a portion of a load pin 338. The actuator assembly 601, in general, includes a plurality of load pins 338, one or more actuators 401 and one or more springs 602. The one or more springs 602, which are disposed between a portion of the carrier member 204 and a portion of a load pin 338, are configured to counteract a load applied by the one or more actuators 401 so that the position of the contacting portion of the load pins 338 are positioned at a desired height or position within the upper recesses 505 at any instant in time as the carrier assembly 104a is rotated about the axis A and simultaneously translated across the surface of the polishing pad 108 during a polishing process. In some embodiments, a contact shoulder 501 of the load pin 338 has a larger thickness than the rest of the body 339 of the load pin 338 so that it can serve as the point of contact 507 (FIGS. 5-6C) between the load pin 338 and the upper recess 505 formed in the carrier retaining ring 502, which is discussed further below. In one example, as illustrated in FIGS. 3A and 3C, each of the plurality of load pins 338 has greater thickness or horizontal width at an end of the length 340 of the body 339, due to the presence of the contact shoulder 501, than the horizontal width of the rest of the length 340 of the load pins 338. In one embodiment, which can be combined with other embodiments disclosed herein, the spring 602 is fabricated from a stainless steel material.

In some embodiments, the system controller 107 is configured to adjust the amount of force applied by one or more of the actuators 401 to the load pins 338 and spring 602 to adjust the position of one or more of the load pins 338 within their respective upper recess 505 at any instant time to compensate for the tilting moment applied to the carrier retaining ring 502. In one example, the system controller 107 is configured to cause one or more actuators 401 to apply a desired amount of force to the load pin ring 504 (FIG. 4A), which includes a plurality of load pins 338, and spring 602 to adjust the position of the load pin ring 504 and load pins 338 relative to the upper recesses 505 formed in the carrier retaining ring 502. In another example, the system controller 107 is configured to cause an actuator 401 to apply a desired amount of force to a load pin element 511 (FIG. 4B), which includes a load pin 338, and spring 602 to adjust the position of the contacting portion of the load pin 338 relative to the upper recesses 505 formed in the carrier retaining ring 502.

In one embodiment, the one or more force actuators 401 can include a pneumatic actuation device that is configured to receive a gas delivered at a desired pressure through a port (not shown) formed in the carrier member 204 and housing member 202 to deliver the desired amount of force to the load pins 338 and spring 602. In another embodiment, the one or more actuators 401 can include an electromechanical actuation device that is configured to receive electrical power from and through a rotating electrical feedthrough (not shown) formed in the housing member 202. A ratio of number of actuators in an actuator assembly 601 to number of load pins 338 is any suitable ratio to allow sufficient control of the load pins 338, for example, about 1:3 to about 1:1. In some embodiments, each of the actuators in the actuator assembly 601 is coupled to and configured to vertically actuate one or more of the load pins 338 of the plurality of load pins 338. As shown in FIGS. 5 and 6A-6C, a power source 280 may be coupled to one or more of the actuators in the actuator assembly 601. The one or more force actuators 401 and springs 602 are operable to raise and lower the load pin 338 relative to the carrier retaining ring 502 by about 0.001 inches to about 1.25 inches, for example about 0.005 inches to about 1 inch, or between 0.01 inches and 0.5 inches, or even between 0.1 inches and 0.25 inches.

Figure 3B:
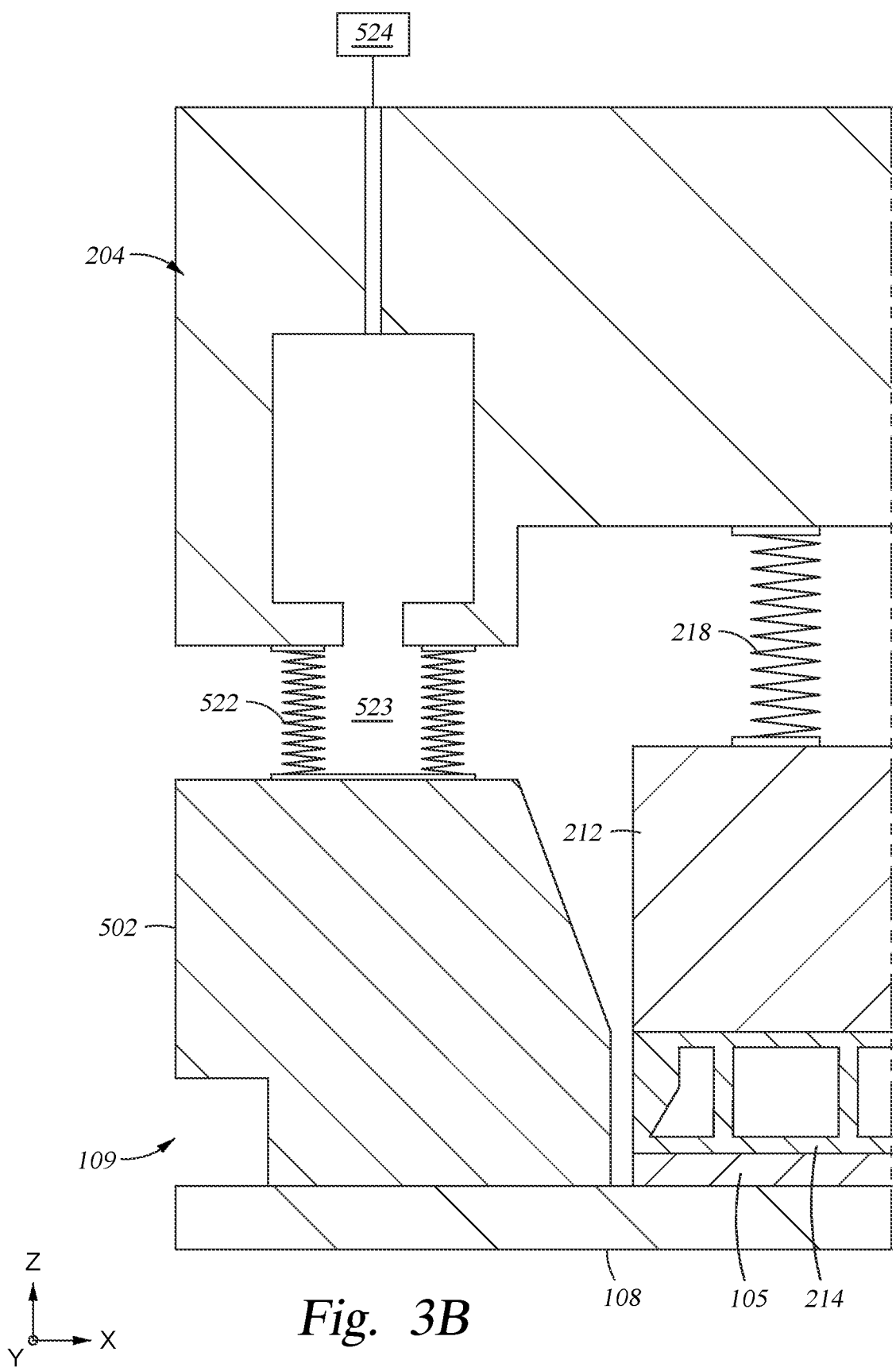
FIG. 3B a cross-sectional view of a different portion of the substrate carrier assembly of FIGS. 2A and 3A according to one embodiment.

In some embodiments, as shown in FIG. 3B, which can be combined with other embodiments described herein, a substantially load applying element 522 is disposed between the carrier retaining ring 502 and the carrier member 204. The cross-sectional view illustrated in FIG. 3B includes a portion of the carrier assembly 104 that is disposed between adjacent load pins 338, and thus the load applying element 522 can include a plurality of regularly spaced sections that are interspersed between the load pins 338 so that a relatively uniform down force can be applied by the load applying element 522 to the carrier retaining ring 502 and polishing pad 108. The load applying element 522 can include a bladder, bellows or other expandable element that is sealed at one end to the carrier member 204. An internal region 523 of the load applying element 522 may be inflated or deflated, by use of a gas source 524, to adjust the amount of down force the carrier retaining ring 502 is able to apply to the surface of the polishing pad 108 during processing, and also adjust the relative position of the carrier retaining ring 502 relative to the load pins 338. The down force applied by the load applying element 522 is adjusted by use of the system controller 107 that controls the gas pressure formed in the internal region 523 by use of one or more pneumatic components (e.g., valves, pressure regulators, etc.) that are able to adjust the pressure of a gas delivered through a port (not shown) formed in the carrier member 204 and housing member 202.

In some embodiments of the substrate carrier assembly 104, a sensor assembly 531 (FIG. 3A) is disposed within the actuator assembly 601 in order to detect and/or measure the relative height of the load pins 338 to a portion of the retaining ring 109. In one embodiment, the sensor assembly 531 includes a retaining ring position sensor 532 and a load pin position sensor 533 that are used singly or in combination to detect and/or measure the relative height of the load pins 338 to a portion of the retaining ring 109. The retaining ring position sensor 532 is configured to measure the distance between the carrier member 204 and a surface of the carrier retaining ring 502. The load pin position sensor 533 is configured to measure the distance between the carrier member 204 and a portion of a load pin 338. In one embodiment, once the relative height of the load pins 338 is determined by a comparison of the signals provided by the sensors 532, 533, the position of the load pins 338 may be adjusted accordingly using the force actuators 401, spring 602 and commands sent from the system controller 107. In some embodiments, by use of a calibration process the average distance between the carrier member 204 and a portion carrier retaining ring 502 can be pre-determined so that only a single input provided by a load pin position sensor 533 is required by the system controller 107 to make an adjustment to the position of the load pins 338 relative to the carrier retaining ring 502. The retaining ring position sensor 532 and load pin position sensor 533 can include a device that is configured to measure the relative distance between parts or surfaces by use of an optical technique (e.g., laser sensors, ultrasonic sensors, or other non-contact displacement or distance measuring sensors) or mechanical technique (e.g., LVDT, wire-activated encoder sensors).

Figure 4A:
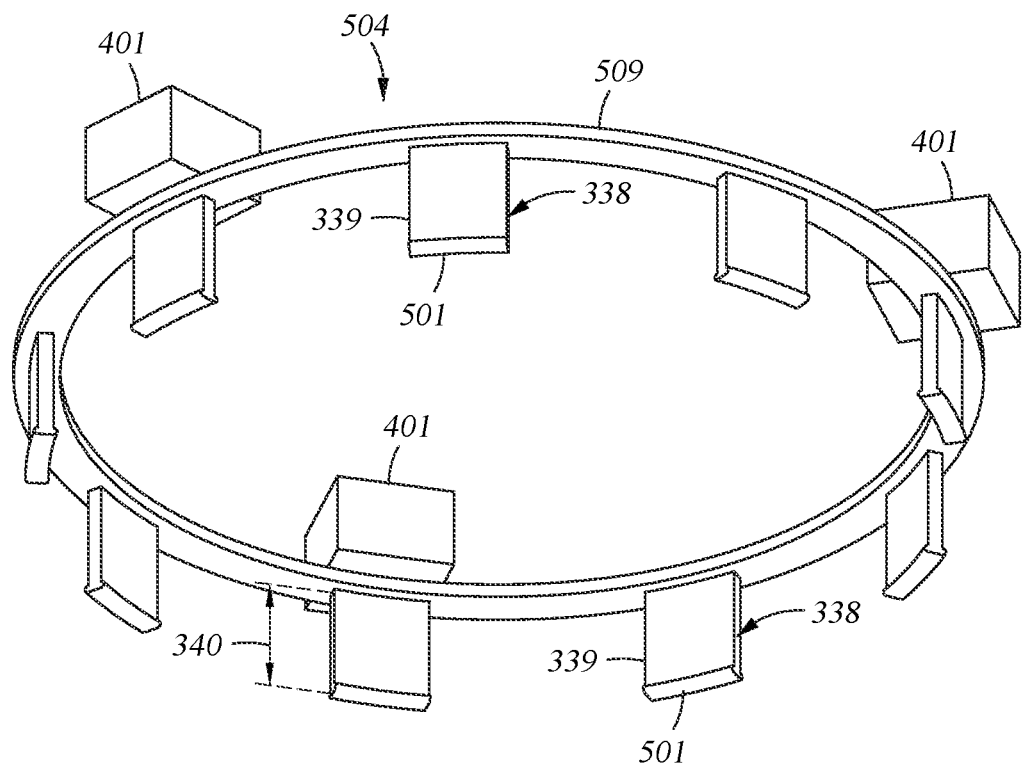
FIG. 4A is a schematic isometric view of a load pin ring that can be positioned within portion of the substrate carrier assembly of FIGS. 2A-2B or 3A-3C according to one or more embodiments described herein.

In some embodiments, as shown in FIG. 4A, the plurality of load pins 338 are coupled together such that they form a load pin ring 504. The load pins 338 within the load pin ring 504 are used to receive and distribute the varying tilting moment created reaction forces received by each load pin 338 as the carrier assembly 104a is rotated about the axis A and simultaneously translated across the surface of the polishing pad 108 during a polishing process. As shown in FIG. 4A, which is a bottom-side isometric view of a load pin ring 504, the load pin ring 504 includes a plurality of load pins 338 (e.g., nine load pins 338 are shown) that are oriented in a circular array, and thus are configured to be disposed within a circular array of upper recesses 505 that are formed within the carrier retaining ring 502. The load pin ring 504 includes a body portion 509, which couples each of the plurality of load pins 338 together. The load pin ring 504 can be formed from a solid structural material, such as a metal (e.g., SST), that can be cast or machined to form one solid structural piece. In some embodiments, the plurality of load pins 338 of the load pin ring 504 are equally spaced within the carrier retaining ring 502. In some embodiments, a contact shoulder 501 of the load pin 338 has a larger thickness than the body 339 of the load pin 338 and serves as the point of contact 507 (FIGS. 5-6) between the load pin 338 and the carrier retaining ring 502, which is discussed further below.

Figure 4B:
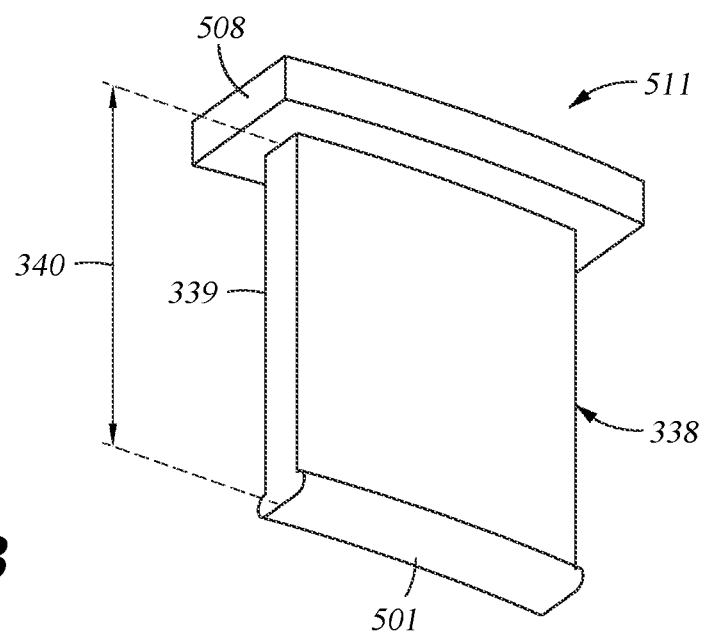
FIG. 4B is a schematic isometric view of a load pin element that can be positioned within portion of the substrate carrier assembly of FIGS. 2A-2B or 3A-3C according to one or more embodiments described herein

However, in some embodiments, each of the plurality of load pins 338 are separately mountable and positionable within a portion of the carrier member 204, and thus in this configuration will allow contacting portion of each of the load pins 338 to be positioned at differing heights relative to an upper recess 505 formed within the retaining ring 109 by use of an actuator 401 that is coupled directly or indirectly to a respective load pin 338. In one configuration, a load pin element 511 can include a load pin 338 that is coupled to a base element 508. The base element 508 is mounted on the upper end of the load pin 338 and can be used to provide an anchoring point or mounting surface for the load pins 338. As shown in FIG. 4B, which is a bottom-side isometric view of load pin elements 511 that can each be separately disposed within a circular array of upper recesses 505 that are formed within the carrier retaining ring 502. The load pin elements 511 can be formed from a solid structural material, such as a metal (e.g., SST), that can be cast or machined to form one solid structural piece.

Generally, the number of load pins 338 and the spacing thereof, in either the load pin element 511 or load pin ring 504 configuration, may be selected to optimize the equal distribution of reaction forces experienced by the retaining ring while reducing cost and substrate carrier assembly 104 complexity. Therefore, in some embodiments, the number of load pins 338 used in a substrate carrier assembly 104 can include, for example, four or more, six or more, eight or more, twelve or more, or any suitable value.

In one embodiment of a load pin 338, the body 339 of each load pin 338 are roughly I-shaped, with approximately the same thickness throughout. In another embodiment, the body 339 of each of the load pins 338 are roughly T-shaped, with a greater horizontal width at the end of the load pin 338 that is not in contact with the carrier retaining ring 502 for the purpose of coupling the load pins 338 to the load pin ring 504. In yet another embodiment, the body 339 of each of the load pins 338 are roughly L-shaped, with a greater horizontal width at the end of the load pin 338 that is configured to contact the carrier retaining ring 502. The body 339 has a length 340 and a cross-sectional area that is measured in a direction that perpendicular to the length 340. In general, the length 340 and cross-sectional area for a particular material (e.g., 316 SST) are both sized so that load pins do not yield or break during normal use. In one example, the length 340 is between 12 mm and 60 mm, such as between 16 mm and 50 mm, or even between 18 mm and 40 mm. In some embodiments, the amount of overlap between the portion of the body 339 that is disposed within an upper recess 505 formed in the carrier retaining ring 502 and the upper recess 505 during processing can be between 10% and 95% of length 340 of the body, such as between 40% and 90% of length 340.

FIG. 3C a cross-sectional view of a portion of the substrate carrier assembly of FIG. 2B according to one embodiment. More particularly, FIG. 3C is an expanded, cross-sectional view of the retaining ring 109 and a carrier ring assembly 206 that are both coupled to the carrier member 204. According to one embodiment, which can be combined with other embodiments disclosed herein, the retaining ring 109 includes a carrier retaining ring 502 with a plurality of upper recesses 505 configured to accept at least a portion of the load pins 338, wherein the carrier retaining ring 502 includes a protrusion 503 on the radially outward face of the carrier retaining ring 502. The protrusion 503 may be an annular protrusion, extending around the entirety of the carrier retaining ring 502 or there may be a discrete number of protrusions 503 extending from the radially outward face of the carrier retaining ring 502, such as 2 or more, 5 or more, 10 or more protrusions 503. The protrusion 503 prevents unwanted liquids, particles, and other contaminants from becoming trapped in spaces adjacent to the carrier retaining ring 502. Each of the plurality of load pins 338 is disposed in each of the plurality of upper recesses 505 of the carrier retaining ring 502. In some embodiments, the plurality of load pins 338 are coupled together such that they form a load pin ring 504, as described above. In other embodiments, each of the plurality of load pins 338 are separately mountable and positionable within a portion of the carrier member 204, and thus may be configured similar to the load pin elements 511 described above. In some embodiments, the plurality of load pins 338 are equally spaced within the carrier retaining ring 502.

In some embodiments of the substrate carrier assembly 104b, which can be combined with other embodiments described herein, a load applying element, such as a U-shaped bladder 512, is disposed between the carrier retaining ring 502 and the carrier member 204. The U-shaped bladder 512 may be sealed at one end that is coupled to the carrier retaining ring 502 by use of a clamp 513, and sealed at an opposing end by a U-shaped plate 514 that clamps a portion of the U-shaped bladder 512 to a portion of the carrier member 204. An internal region 512A of the U-shaped bladder 512 may be inflated or deflated to adjust the amount of down force the carrier retaining ring 502 is able to apply to the surface of the polishing pad 108 during processing, and also adjust the relative position of the carrier retaining ring 502 relative to the load pins 338. The down force applied by the U-shaped bladder 512 is adjusted by controlling the gas pressure formed in the internal region 512A by controlling the pressure of a gas delivered through a port (not shown) formed in the carrier member 204, housing member 202 and U-shaped plate 514.

In some embodiments of the substrate carrier assembly 104b, a pressure can be formed and controlled within the second volume 232 by use of a gas source and the system controller 107 so that an adjustable down force can also be separately generated on the polishing pad 108 by carrier ring assembly 206 that is coupled to the carrier member 204. The pressure formed within the second volume 232 will influence the vertical deflection of the carrier member 204 with respect to the housing member 202, and thus allow a down force to be separately applied to a polishing pad 108 by a carrier ring assembly 206 versus the carrier retaining ring 502.

In some embodiments of the substrate carrier assembly 104, it is contemplated that the contacting portion of the load pins 338 (e.g., contact shoulder 501) are fixed with respect to the carrier member 204, but are configured to be positioned at a desired position with respect to the upper recesses 505 of the carrier retaining ring 502. In this configuration, an actuator assembly 601 is not required and the body 509 of the load pin ring 504, or base element 508 of the load pin element 511, can be mounted on or coupled to a portion of the carrier member 204, and thus will allow the load pins 338 to remain stationary with respect to the carrier member 204 during processing. Therefore, by use of modelling and/or prior testing a vertical length (e.g., length 340) of the load pins 338 (e.g., insertion depth within the upper recesses 505) can be determined such that load pins 338 are positioned at a desired average height relative to a depth within the upper recesses 505 and relative to the surface of the polishing pad 108 to desirably counteract the tilting moment generated during processing.

Figure 5:
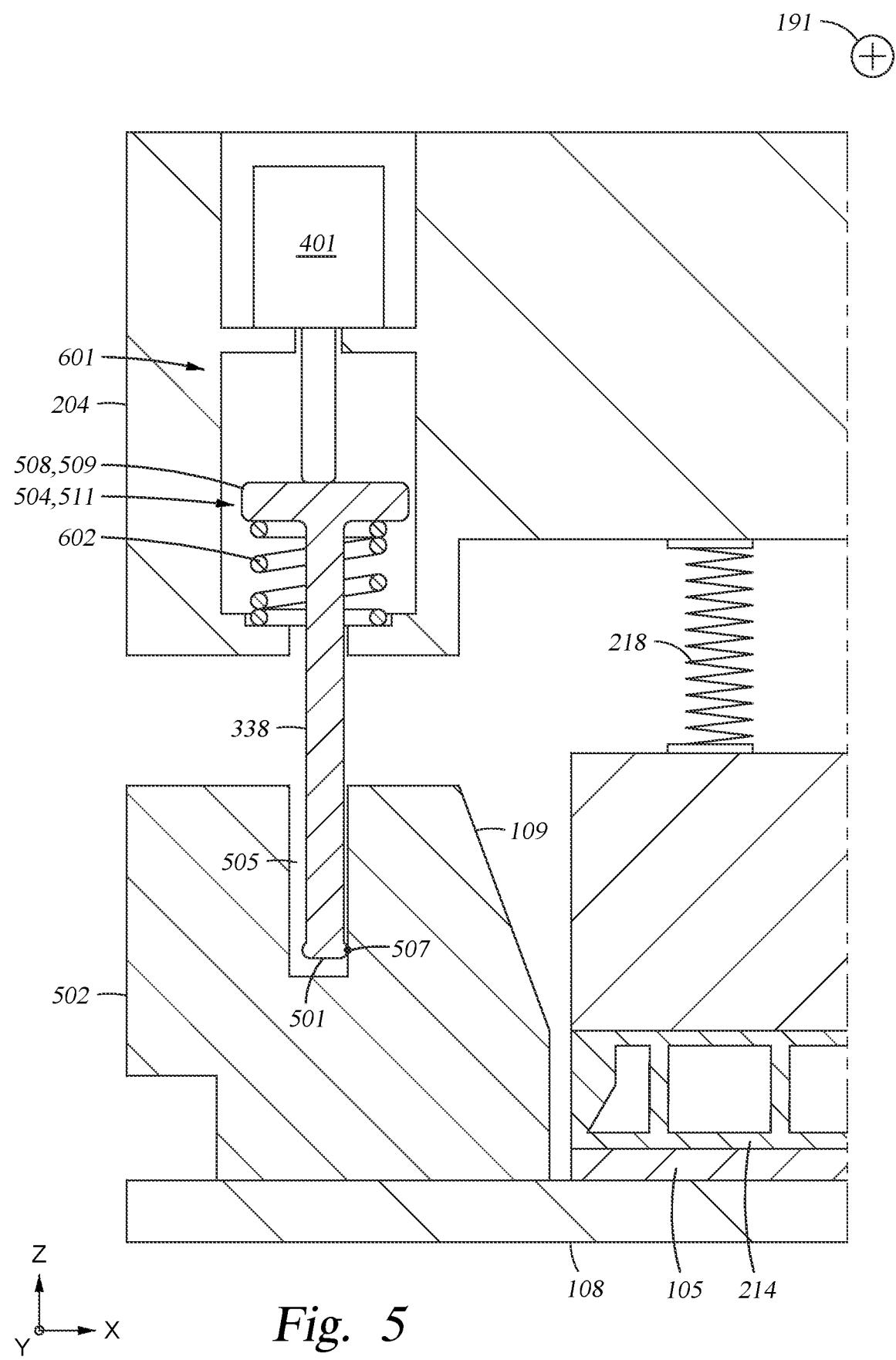
FIG. 5 is a cross-sectional view of a portion of the carrier ring assembly of FIGS. 2A-2B according to one or more embodiments.

FIGS. 5 and 6A-6C are schematic cross-sectional views of a portion of the substrate carrier assembly 104 of FIGS. 2A-2B, 3A and 3C, and are intended to illustrate the effect that one or more of the embodiments of the disclosure provided herein have on minimizing the effect of the tilting moment MG created during a polishing process. FIG. 5 is schematic representation of various elements of the polishing station 102 used in one or more of the embodiments of the disclosure provided herein. While not intending to be limiting as to the scope of the disclosure provided herein, FIGS. 5 and 6A-6C include a substrate carrier assembly 104 that includes an actuator assembly 601 that is configured to position the load pins 338 (e.g., contact shoulder 501) relative to a portion of the upper recesses 505. As discussed above, the force actuators 401 may include a pneumatic, piezo-electric, electro-mechanic, or any other suitable device that is able to position the load pins 338 relative to the carrier member 204 by compressing the spring 602 to a desired height.

During processing the carrier retaining ring 502 is urged against the surface of the polishing pad 108 by use of load generating device, such as the U-shaped bladder 512 or load applying element 522, and the substrate 105, which is disposed adjacent to the carrier retaining ring 502, is urged against the surface of the polishing pad by use of the first membrane 214. During processing a polishing shear force 802 (FIG. 6A) is generated at the lower surface of carrier retaining ring 502 due to the friction created between the carrier retaining ring 502 and the surface of the polishing pad. Therefore, by adjusting the position of contacting portion of the load pins 338 (e.g., contact shoulder 501) within the upper recesses 505, an opposing reaction force 801 (FIG. 6A) is created due to the contact between a portion of the load pin 338 and a portion of the upper recess 505, so that an opposing moment, or counter acting moment, is created that will counteract the tilting moment so that the magnitude of the tilting moment can be, eliminated, controlled, kept constant or at least minimized during processing. Since the carrier retaining ring 502 is positioned near the edge of the substrate 105 and is configured to reduce the high contact forces commonly experienced at the edge of the substrate (e.g., "check mark" effect or "knife edge" effect) during processing, by reducing the tilting moment experienced by the carrier retaining ring 502, and thus allowing the lower surface of the retaining ring (e.g., polishing pad contact surface) to uniformly contact the surface of the polishing pad, the pressure distribution on the substrate 105 during polishing, particularly in a radial direction relative to the substrate 105 center, can be made more uniform.

Figure 6A:
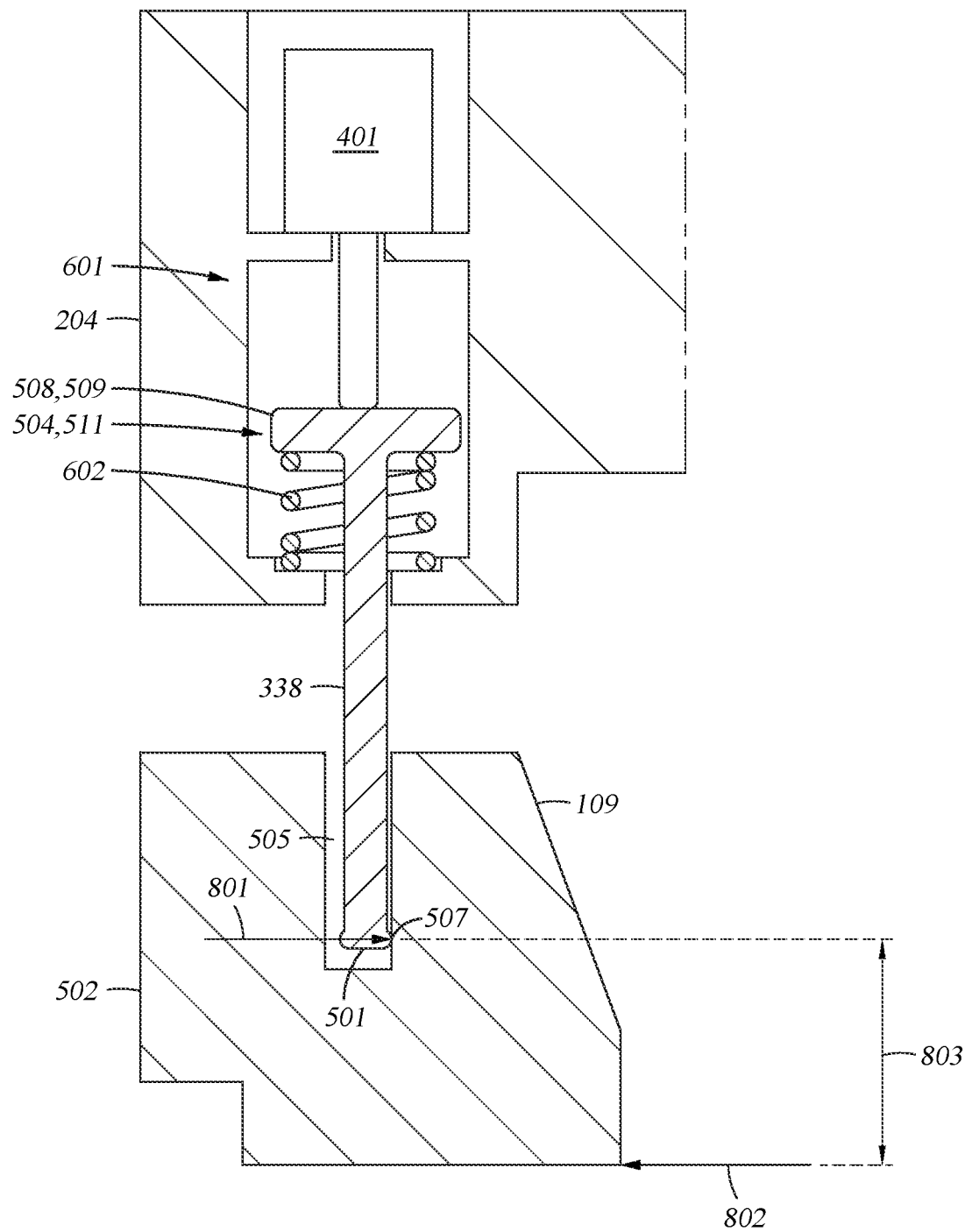
FIGS. 6A-6C are cross-sectional views illustrating forces exerted on the portion of the carrier ring assembly shown in FIG. 5 according to one or more embodiments.
Figure 6B:
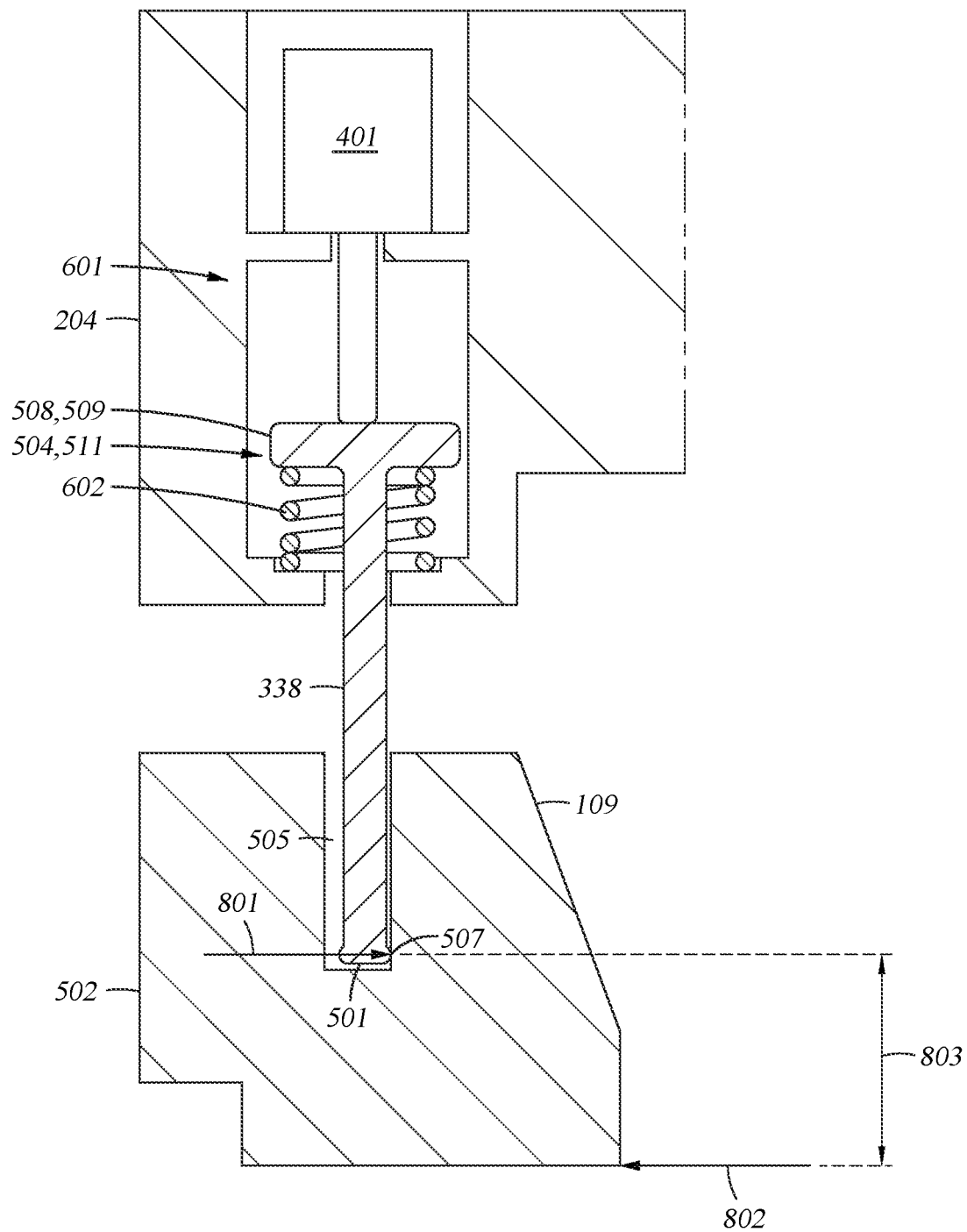
Figure 6C:
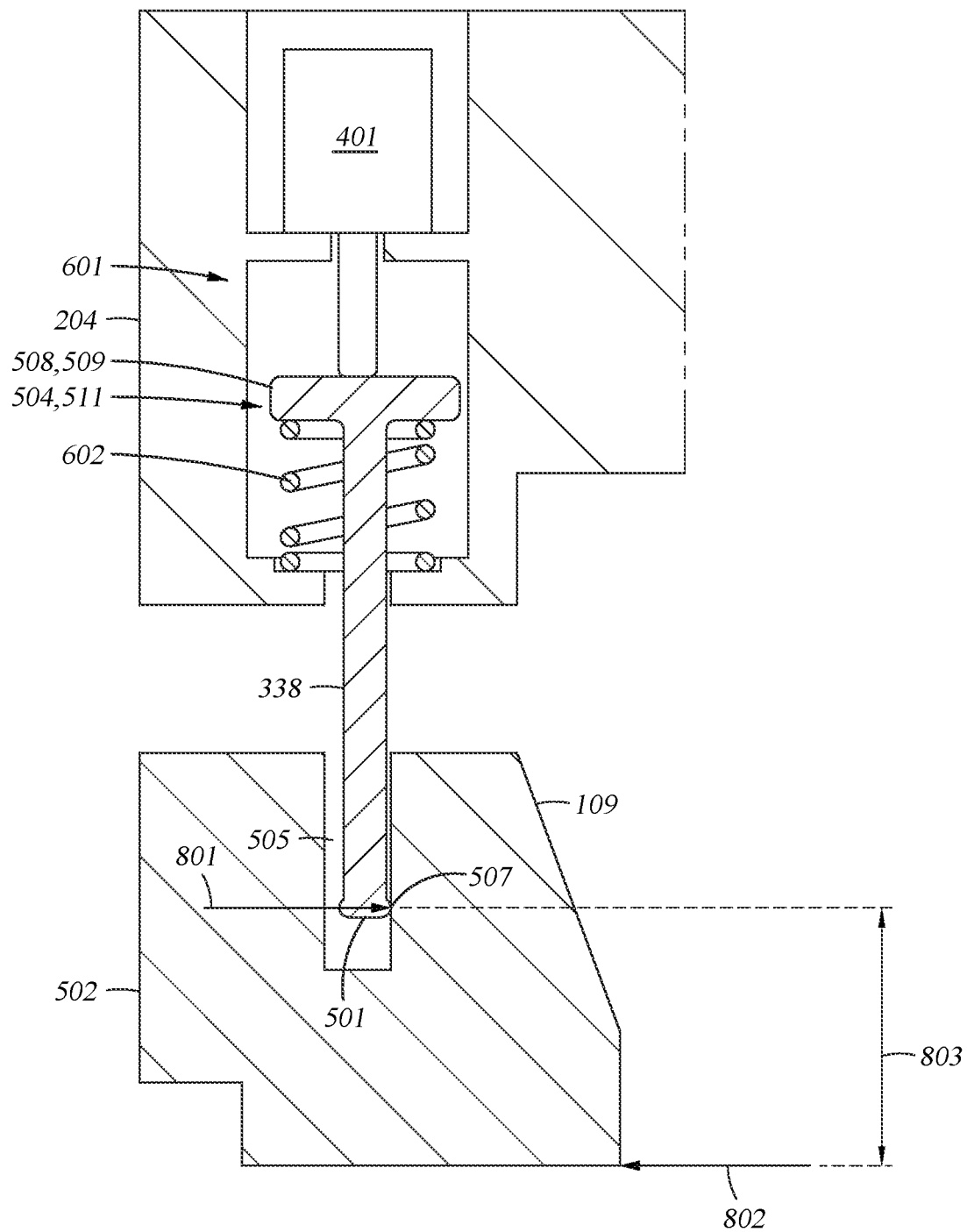

FIGS. 6A-6C illustrate forces exerted on the portion of the retaining ring 109 of FIG. 5 according to one or more embodiments. As discussed above, due to the resistance of the elements that couple the substrate carrier assembly 104 to the polishing system to the changing position of the retaining ring relative to polishing pad as the retaining ring and the polishing pad are rotated and moved relative to each other during a CMP polishing process, the tilting moment MG is formed. Also, during processing, the substrate 105, the first membrane 214, or other inner components of the substrate carrier assembly 104a-b often shift underneath the carrier slightly and impact an inner surface of the carrier retaining ring 502 at a first contact point, resulting in lateral impact forces exerted on the radially inner surface of the carrier retaining ring 502. A polishing shear force 802 is also exerted on the carrier retaining ring 502 as the retaining ring and the polishing pad are moved relative to each other during a CMP polishing process. The culmination of these lateral forces exerted on the radially inner surface of the carrier retaining ring 502 leads to the reaction force 801, acting on the carrier retaining ring 502 by the contact shoulder 501 of the load pins 338. Adjusting the vertical location of the point of contact 507 between the load pin 338 and the carrier retaining ring 502, i.e. adjust the location of the resulting force 801, increases or decreases the moment generated to counteract the tilting moment experienced by the carrier retaining ring 502 during a polishing process.

Put another way, by adjusting the position of the load pins 338, an offset distance 803, or distance, or height, 803, between the lower surface of the carrier retaining ring 502 on which the polishing shear force 802 is created and the reaction force 801 can be increased or decreased. If the offset distance 803 is decreased as shown in FIG. 6B versus FIG. 6A, the resulting tilting moment of the carrier retaining ring 502 is decreased. The counteracting tilting moment produced by the resulting force 801 is directly proportional to the offset distance 803 and the polishing shear force 802 applied at the lower surface of the substrate carrier retaining ring 502. An increased offset distance 803 as shown in FIG. 6C results in an increase in the counteracting tilting moment of the carrier retaining ring 502. If the offset distance 803 is increased further as shown in FIG. 6C, the resulting counteracting tilting moment of the carrier retaining ring 502 is increased. By monitoring the offset distance 803 with a sensor and/or system controller 107, the counteracting tilting moment of the carrier retaining ring 502 can be controlled by using the actuator assemblies 601 to vertically actuate the load pin 338 in order to increase the offset distance 803 if the tilting moment is undesirably large, and decrease the offset distance 803 if the tilting moment is small. In some embodiment, it may be desirable to maintain a constant counteracting tilting moment despite the wear on the carrier retaining ring 502, polishing pad 108 or other components of the retaining ring 109.

Embodiments of the present disclosure allow for improved control over the forces experienced by retaining rings in polishing modules. This improved control correlates to improved pressure distribution control over the surface of the substrate 105 and results in improved substrate polishing uniformity.

While the foregoing is directed to embodiments of the present disclosure, other and further embodiments of the disclosure may be devised without departing from the basic scope thereof, and the scope thereof is determined by the claims that follow.

What is claimed is:

1. A substrate carrier for polishing a surface of a substrate, comprising:
  a retaining ring configured to surround a substrate during a polishing process, the retaining ring comprising:
    a first surface that is configured to contact a surface of a polishing pad during the polishing process;
    a second surface that is on a side of the retaining ring that is opposite to the first surface; and
    an array of recesses formed in the second surface; and
  a plurality of load bearing pins, wherein
    each load bearing pin of the plurality of load bearing pins comprises a body that has a lower end and an upper end, the lower end of the body having a contact shoulder that has a larger thickness than the rest of the body, the upper end being coupled to a base element that has a larger thickness than the body,
    the lower end of the body of each load bearing pin of the plurality of load bearing pins is disposed within each recess of the array of recesses, and
    the contact shoulder of each load bearing pin of the plurality of load bearing pins is positionable relative to a surface of the recess in which it is disposed during the polishing process.

2. The substrate carrier of claim 1, further comprising an actuator assembly coupled to one or more of the plurality of load bearing pins, the actuator assembly configured to adjust a position of the contact shoulder of one or more of the plurality of load bearing pins relative to the surface of the recess in which it is disposed.

3. The substrate carrier of claim 2, further comprising:
a carrier member comprising a support surface,
wherein the actuator assembly further comprises:
    a return spring disposed between the support surface and a portion of each load bearing pin of the plurality of load bearing pins; and
    a force actuator coupled to the carrier member and configured to compress or decompress the return spring when the position of the contact shoulder is adjusted relative to the surface of the recess.

4. The substrate carrier of claim 1, further comprising one or more actuator assemblies coupled to one or more of the plurality of load bearing pins, the one or more actuator assemblies is configured to adjust a position of the contact shoulder of one or more of the plurality of load bearing pins relative to the surface of the recess in which it is disposed, wherein a ratio of number of actuator assemblies to number of load bearing pins is between about 1:3 and about 1:1.

5. The substrate carrier of claim 1, further comprising:
a carrier member; and
a load applying element disposed between the retaining ring and the carrier member, wherein the load applying element is configured to urge the first surface of the retaining ring against a polishing pad when a positive pressure is applied within an internal region of the load applying element.

6. The substrate carrier of claim 5, wherein each of the plurality of load bearing pins is fixed with respect to the carrier member.

7. The substrate carrier of claim 1, wherein the base element is mounted on the upper end of the each load bearing pin of the plurality of load bearing pins and is configured to provide a mounting surface for the each load bearing pin of the plurality of load bearing pins.

8. A substrate carrier for polishing a surface of a substrate, comprising:
a retaining ring configured to surround a substrate during a polishing process, the retaining ring comprising:
    a first surface that is configured to contact a surface of a polishing pad during the polishing process;
    a second surface that is on a side of the retaining ring that is opposite to the first surface; and
    an array of recesses formed in the second surface;
a plurality of load bearing pins, each load bearing pin of the plurality of load bearing pins comprises a body having a lower end and an upper end, the lower end of the body having a contact shoulder that has a larger thickness than the rest of the body, the upper end being coupled to a base element that has a larger thickness than the body, and is positionable relative to a surface of the recess in which it is disposed during the polishing process; and
one or more actuator assemblies coupled to one or more of the plurality of load bearing pins, the one or more actuator assemblies configured to adjust a position of the contact shoulder of one or more of the plurality of load bearing pins relative to the surface of the recess in which it is disposed.

9. The substrate carrier of claim 8, wherein the lower end of the body of each load bearing pin of the plurality of load bearing pins is disposed within each recess of the array of recesses.

10. The substrate carrier of claim 8, further comprising:
a carrier member comprising a support surface,
wherein the one or more actuator assemblies further comprises:
    a return spring disposed between the support surface and a portion of each load bearing pin of the plurality of load bearing pins; and
    a force actuator coupled to the carrier member and configured to compress or decompress the return spring when the position of the contact shoulder is adjusted relative to the surface of the recess.

11. The substrate carrier of claim 8, wherein a ratio of number of actuator assemblies to number of load bearing pins is between about 1:3 and about 1:1.

12. The substrate carrier of claim 8, wherein the base element is mounted on the upper end of the each load bearing pin of the plurality of load bearing pins and is configured to provide a mounting surface for the each load bearing pin of the plurality of load bearing pins.

13. A polishing station, comprising:
a platen;
a polishing pad mounted on and secured to the platen; and
a carrier assembly comprising:
    a retaining ring configured to surround a substrate during a polishing process, the retaining ring having a first surface and a second surface opposite the first surface, wherein the first surface is configured to contact a surface of the polishing pad during the polishing process, and the second surface has an array of recesses formed therein; and
    a plurality of load bearing pins, each of the plurality of load bearing pin comprising a body having a lower end disposed within each recess of the array of recesses and an upper end, wherein the lower end of the body has a contact shoulder that has a larger thickness than the rest of the body, and the upper end is coupled to a base element that has a larger thickness than the body.

14. The polishing station of claim 13, wherein the contact shoulder of each load bearing pin of the plurality of load bearing pins is positionable relative to a surface of the recess in which it is disposed during the polishing process.

15. The polishing station of claim 13, wherein the carrier assembly further comprises an actuator assembly coupled to one or more of the plurality of load bearing pins, the actuator assembly configured to adjust a position of the contact shoulder of one or more of the plurality of load bearing pins relative to the surface of the recess in which it is disposed.

16. The polishing station of claim 15, wherein the carrier assembly further comprises:
a carrier member comprising a support surface,
wherein the actuator assembly further comprises:
    a return spring disposed between the support surface and a portion of each load bearing pin of the plurality of load bearing pins; and
    a force actuator coupled to the carrier member and configured to compress or decompress the return spring when the position of the contact shoulder is adjusted relative to the surface of the recess.

17. The polishing station of claim 13, wherein the carrier assembly further comprises one or more actuator assemblies coupled to one or more of the plurality of load bearing pins, the one or more actuator assemblies is configured to adjust a position of the contact shoulder of one or more of the plurality of load bearing pins relative to the surface of the recess in which it is disposed, wherein a ratio of number of actuator assemblies to number of load bearing pins is between about 1:3 and about 1:1.

18. The polishing station of claim 13, wherein the carrier assembly further comprises:
   a carrier member; and
   a load applying element disposed between the retaining ring and the carrier member, wherein the load applying element is configured to urge the first surface of the retaining ring against a polishing pad when a positive pressure is applied within an internal region of the load applying element.

19. The polishing station of claim 18, wherein each of the plurality of load bearing pins is fixed with respect to the carrier member.

20. The polishing station of claim 13, wherein the base element is mounted on the upper end of the each load bearing pin of the plurality of load bearing pins and is configured to provide a mounting surface for the each load bearing pin of the plurality of load bearing pins.

\* \* \* \* \*